US012683131B2

(12) United States Patent
Li et al.

(10) Patent No.: US 12,683,131 B2
(45) Date of Patent: Jul. 14, 2026

(54) APPARATUS AND METHODS FOR CONTROLLING SUBSTRATE TEMPERATURE DURING PROCESSING

(71) Applicant: Applied Materials, Inc., Santa Clara, CA (US)

(72) Inventors: Jian Li, Fremont, CA (US); Juan Carlos Rocha-Alvarez, San Carlos, CA (US); Vijay D. Parkhe, San Jose, CA (US); Wenhao Zhang, San Jose, CA (US); Mayur Govind Kulkarni, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 553 days.

(21) Appl. No.: 18/122,574

(22) Filed: Mar. 16, 2023

(65) Prior Publication Data

US 2024/0312770 A1 Sep. 19, 2024

(51) Int. Cl.
| | |
|---|---|
| *H01J 37/32* | (2006.01) |
| *C23C 16/455* | (2006.01) |
| *C23C 16/458* | (2006.01) |
| *C23C 16/46* | (2006.01) |
| *C23C 16/50* | (2006.01) |
| *C23C 16/52* | (2006.01) |

(52) U.S. Cl.
CPC .. *H01J 37/32724* (2013.01); *C23C 16/45565* (2013.01); *C23C 16/4586* (2013.01); *C23C 16/463* (2013.01); *C23C 16/50* (2013.01); *C23C 16/52* (2013.01); *H01J 2237/2001* (2013.01); *H01J 2237/3321* (2013.01)

(58) Field of Classification Search
None
See application file for complete search history.

(56) References Cited

U.S. PATENT DOCUMENTS

| | | | | |
|---|---|---|---|---|
| 5,536,319 A | * | 7/1996 | Wary | C23C 16/46 |
| | | | | 118/724 |
| 5,536,322 A | * | 7/1996 | Wary | C23C 16/52 |
| | | | | 427/255.6 |
| 5,863,376 A | | 1/1999 | Wicker et al. | |
| 6,000,227 A | * | 12/1999 | Kroeker | H01L 21/67115 |
| | | | | 62/62 |
| 6,180,926 B1 | * | 1/2001 | Duddy | C23C 16/4585 |
| | | | | 118/725 |
| 6,449,844 B2 | * | 9/2002 | Duddy | C23C 16/46 |
| | | | | 29/890.03 |
| 6,838,646 B2 | | 1/2005 | Inazumachi et al. | |
| 7,624,772 B2 | * | 12/2009 | Iwabuchi | H01L 21/67248 |
| | | | | 156/345.31 |

(Continued)

*Primary Examiner* — Jethro M. Pence
(74) *Attorney, Agent, or Firm* — Patterson + Sheridan, LLP

(57) ABSTRACT

A substrate support assembly includes a shaft with a platen extending perpendicularly from the shaft at an upper end of the shaft. The shaft includes an electric line and a plurality of coolant conduits. A cooling plate including a coolant channel fluidically coupled to the coolant conduits is mounted to the platen, and extends beyond an outer rim of the platen. A puck assembly including a heater is mounted to the cooling plate. A simultaneous operation of the heater and a flow of coolant through the coolant channel regulates a temperature gradient across the puck assembly during a substrate processing operation.

12 Claims, 10 Drawing Sheets

(56) References Cited

U.S. PATENT DOCUMENTS

| | | | |
|---|---|---|---|
| 7,651,584 B2 * | 1/2010 | Amikura | C23C 16/45572 |
| | | | 118/724 |
| 8,147,648 B2 * | 4/2012 | Dhindsa | H01J 37/32091 |
| | | | 156/345.43 |
| 8,196,619 B2 * | 6/2012 | Iwabuchi | C23C 16/46 |
| | | | 141/82 |
| 9,064,911 B2 * | 6/2015 | Roy | H01L 21/67109 |
| 9,392,643 B2 * | 7/2016 | Singh | H01L 21/6831 |
| 9,659,803 B2 * | 5/2017 | Lubomirsky | H01L 21/67 |
| 9,773,647 B2 * | 9/2017 | Matsuura | H01J 37/32522 |
| 9,790,589 B2 * | 10/2017 | West | C23C 14/50 |
| 9,941,101 B2 * | 4/2018 | Matsuura | C23C 16/45565 |
| 10,008,399 B2 * | 6/2018 | Parkhe | H01J 37/32477 |
| 10,008,404 B2 * | 6/2018 | Parkhe | H01L 21/6831 |
| 10,332,772 B2 * | 6/2019 | Tantiwong | H01L 21/6833 |
| 10,344,375 B2 * | 7/2019 | West | H01J 37/32724 |
| 10,557,202 B2 * | 2/2020 | Boyd, Jr. | C23C 14/50 |
| 10,566,205 B2 * | 2/2020 | Salinas | H01L 21/67201 |
| 10,811,234 B2 * | 10/2020 | Matsuura | H01J 37/32091 |
| 10,879,053 B2 | 12/2020 | Ricci et al. | |
| 10,950,477 B2 | 3/2021 | Lin et al. | |
| 10,957,572 B2 * | 3/2021 | Parkhe | H01L 21/67103 |
| 10,984,990 B2 * | 4/2021 | Bokka | C23C 16/50 |
| 11,049,755 B2 * | 6/2021 | Benjaminson | H01J 37/32724 |
| 11,244,839 B2 * | 2/2022 | Lee | H01L 21/6833 |
| 11,309,203 B2 | 4/2022 | Tomizawa et al. | |
| 11,322,337 B2 * | 5/2022 | Lubomirsky | H01L 21/68785 |
| 11,742,225 B2 * | 8/2023 | Parkhe | H01L 21/67109 |
| | | | 29/446 |
| 11,764,041 B2 * | 9/2023 | Garcia De Gorordo | |
| | | | H01L 21/6831 |
| | | | 361/234 |
| 11,776,794 B2 * | 10/2023 | Parkhe | H01L 21/6833 |
| | | | 361/234 |
| 11,810,767 B2 * | 11/2023 | Takebayashi | H01L 21/3065 |
| 11,887,811 B2 * | 1/2024 | Paul | C23C 16/503 |
| 11,915,950 B2 * | 2/2024 | Samir | H01J 37/32724 |
| 12,033,837 B2 * | 7/2024 | Parkhe | H01L 21/68757 |
| 12,136,540 B2 * | 11/2024 | Kim | C23C 14/541 |
| 12,347,659 B2 * | 7/2025 | Parkhe | H01L 21/67109 |
| 2003/0047282 A1 * | 3/2003 | Sago | C23C 16/45572 |
| | | | 156/345.33 |
| 2007/0029642 A1 * | 2/2007 | Inagawa | H01L 21/67109 |
| | | | 257/625 |
| 2009/0151639 A1 * | 6/2009 | Kasai | C23C 16/14 |
| | | | 118/724 |
| 2009/0173444 A1 * | 7/2009 | Sago | C23C 16/45572 |
| | | | 118/723 R |
| 2013/0276980 A1 * | 10/2013 | Lubomirsky | H01J 37/32715 |
| | | | 156/345.29 |
| 2016/0203955 A1 * | 7/2016 | Kambara | H01J 37/32715 |
| | | | 165/96 |
| 2018/0337026 A1 * | 11/2018 | Firouzdor | C23C 16/45525 |
| 2018/0337074 A1 * | 11/2018 | Samir | H01L 21/67103 |
| 2019/0131113 A1 * | 5/2019 | Fenwick | C23C 14/3442 |
| 2019/0341289 A1 * | 11/2019 | Parkhe | H01L 21/68785 |
| 2020/0035464 A1 * | 1/2020 | Kambara | H01J 37/32724 |
| 2020/0176230 A1 * | 6/2020 | Lu | H01L 21/67248 |
| 2021/0035844 A1 * | 2/2021 | Cho | H01L 21/68721 |
| 2022/0076920 A1 * | 3/2022 | Paul | H01L 21/6831 |
| 2022/0127723 A1 | 4/2022 | Li et al. | |
| 2022/0301867 A1 * | 9/2022 | Tannos | H01J 37/32724 |
| 2023/0162955 A1 * | 5/2023 | Parkhe | H01J 37/32715 |
| | | | 118/723 R |
| 2023/0238258 A1 * | 7/2023 | Inoue | H01L 21/6831 |
| | | | 118/124 |
| 2023/0343552 A1 * | 10/2023 | Paul | H01J 37/32715 |
| 2024/0379334 A1 * | 11/2024 | Jang | H01J 37/32724 |
| 2024/0420932 A1 * | 12/2024 | Sarode Vishwanath | |
| | | | H01J 37/32449 |
| 2025/0112075 A1 * | 4/2025 | Sulyman | H01L 21/6833 |
| 2025/0183085 A1 * | 6/2025 | Baggett | H01L 21/6831 |
| 2025/0285845 A1 * | 9/2025 | Cho | H01L 21/68742 |
| 2025/0293009 A1 * | 9/2025 | Zhang | H01L 21/67109 |

* cited by examiner

_300_

CALCULATE A HEAT BALANCE FOR A PLASMA PROCESSING OPERATION TO BE PERFORMED ON A SUBSTRATE — _302_

DETERMINE A DESIRED THERMAL CONDUCTIVITY OF A THERMAL CHOKE MATERIAL TO BE USED AS A THERMAL CHOKE LAYER IN A SUBSTRATE SUPPORT ASSEMBLY — _304_

INSTALL THE THERMAL CHOKE MATERIAL INTO THE SUBSTRATE SUPPORT ASSEMBLY — _306_

PERFORM THE PLASMA PROCESSING OPERATION — _308_

APPARATUS AND METHODS FOR CONTROLLING SUBSTRATE TEMPERATURE DURING PROCESSING

BACKGROUND

Field

Embodiments of the present disclosure generally relate to apparatus and methods for processing substrates. More particularly, embodiments are directed to the control of substrate temperature during processing.

Description of the Related Art

The processing of substrates is typically performed in chambers, in which the substrates are exposed to heat and reactive chemicals. In some processing operations, the chemicals may be present in the form of a plasma. In some instances, the substrate becomes heated by the plasma beyond a desired temperature. Sometimes, the heating of the substrate by the plasma necessitates pausing the processing operation to allow the substrate to cool before continuing the processing operation. In some cases, processing operations must be paused several times, which adversely affects the throughput of a chamber by unduly lengthening the overall duration of the processing operations. Additionally, temperature gradients across substrates undergoing processing, such as caused by hot spots and cold spots in a substrate support, can detrimentally affect the uniformity of substance deposition on substrates, and hence impact the quality of the finished product.

Thus, there is a need for improved systems and processes that mitigate the above issues.

SUMMARY

The present disclosure concerns apparatus and methods for processing substrates, and more specifically towards controlling substrate temperature during a processing operation, such as during a plasma processing operation. In one implementation, a substrate support assembly includes a shaft and a platen. The shaft includes a plurality of coolant conduits. The platen extends perpendicularly from the shaft at an upper end of the shaft, and a cooling plate is mounted to the platen. The cooling plate includes a coolant channel fluidically coupled to the plurality of coolant conduits. A puck assembly is mounted to the cooling plate, and is secured thereto by a plurality of first fasteners extending through the cooling plate. The substrate support assembly further includes a clamp ring mounted to an underside of the cooling plate by a plurality of second fasteners. The clamp ring sealingly covers the first fasteners and encircles the platen.

In another implementation, a substrate support assembly includes a shaft and a platen. The shaft includes a plurality of coolant conduits. The platen extends perpendicularly from the shaft at an upper end of the shaft, and a cooling plate is mounted to the platen. The cooling plate includes a first portion coupled to the platen, and a second portion extending beyond an outer rim of the platen. A coolant channel is fluidically coupled to the plurality of coolant conduits at the first portion. The coolant channel extends from the first portion into the second portion, and defines a pathway including a plurality of loops in the second portion.

A puck assembly is mounted to the cooling plate, and a thermal choke layer is disposed between the puck assembly and the cooling plate.

In another implementation, a method of executing a plasma processing operation on a substrate includes calculating a heat balance for the plasma processing operation, and determining, from the heat balance, a desired thermal conductivity of a thermal choke material to be used as a thermal choke layer in a substrate support assembly. The method further includes installing the thermal choke material into the substrate support assembly. A thermal conductivity of the thermal choke material corresponds to the desired thermal conductivity. The method further includes then performing the plasma processing operation while simultaneously: using a heater of the substrate support assembly to heat the substrate; and flowing a coolant through the substrate support assembly.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, as the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure concerns apparatus and methods for processing substrates, and more specifically towards controlling substrate temperature during a processing operation, such as during a plasma processing operation.

Figure 1:
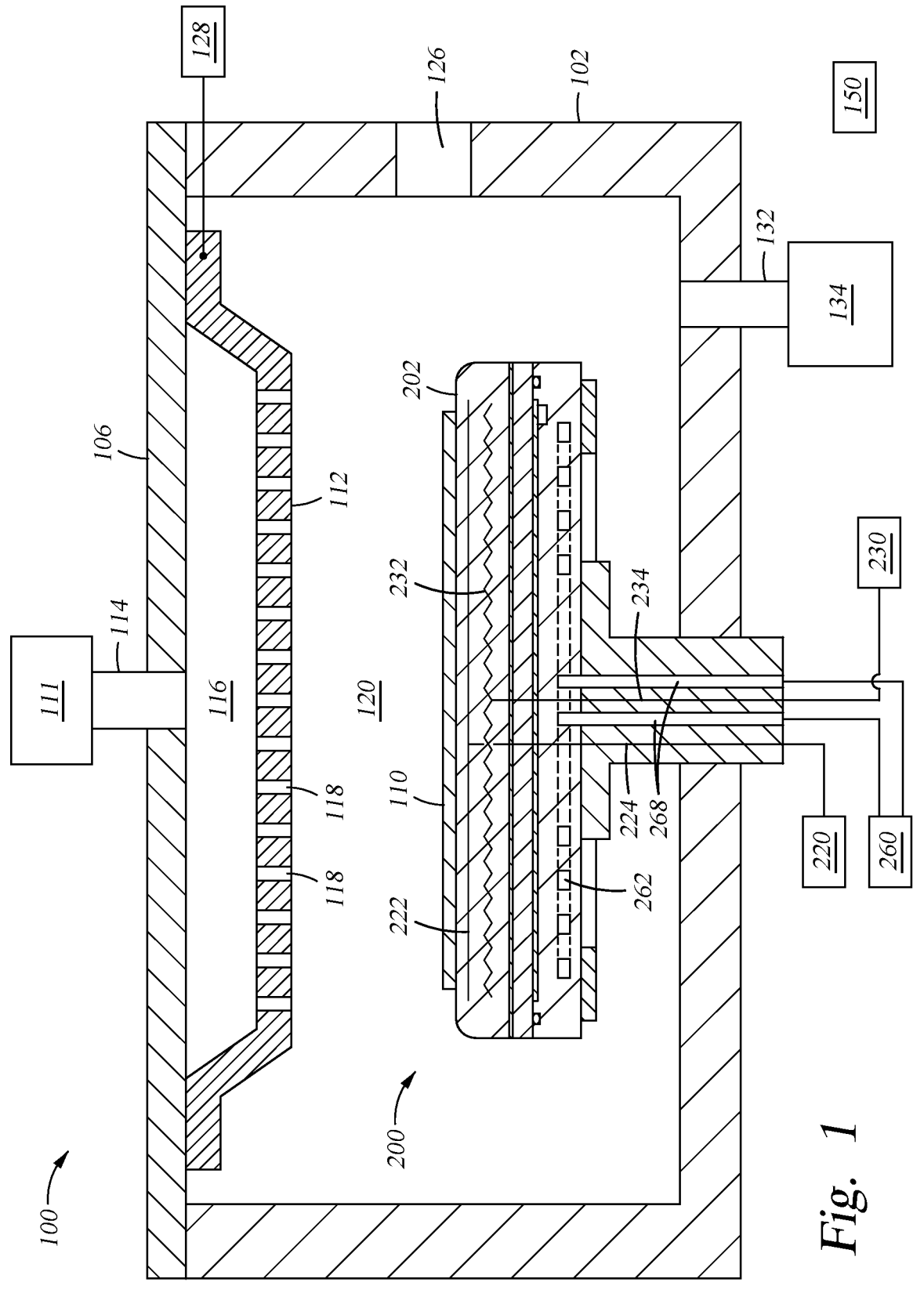
FIG. 1 illustrates a schematic cross-sectional view of a processing chamber.

FIG. 1 illustrates a schematic cross-sectional view of a processing chamber 100. As illustrated, the processing chamber 100 is configured as a Plasma Enhanced Chemical Vapor Deposition (PECVD) chamber, although in some embodiments that may be combined with other embodiments, processing chamber 100 may be configured to perform another plasma-enhanced processing operation (such as etching or physical vapor deposition) or a processing operation that does not involve plasma (such as chemical vapor deposition). The processing chamber 100 features a chamber body 102, a substrate support assembly 200 disposed inside the chamber body 102, and a lid 106 coupled to the chamber body 102, and enclosing the substrate support assembly 200 in a processing volume 120. The substrate support assembly 200 is configured to support a substrate 110 on a support surface 202 during processing. The substrate 110 is provided to the processing volume 120 through an opening 126. While the embodiment of FIG. 1 is directed to a PECVD chamber, the lid 106 and substrate support assembly 200 of FIG. 1 may be used with other processing chambers that utilize plasma generated in the processing volume 120. Additionally, the lid 106 and substrate support assembly 200 of FIG. 1 may be used with other processing chambers that do not utilize plasma generated in the processing volume 120.

A gas supply source 111 includes one or more gas sources. The gas supply source 111 is configured to deliver the one or more gases from the one or more gas sources into the processing volume 120. Each of the one or more gas sources provides a process gas such as silane, disilane, tetraethyl orthosilicate (TEOS), germane, a metal halide (such as titanium tetrachloride, tantalum pentachloride, tungsten hexafluoride), an organometallic (such as tetrakis(dimethyl-amido) titanium, pentakis(dimethylamido) tantalum), ammonia, oxygen ($O_2$), hydrogen peroxide, hydrogen, diborane, chlorine ($Cl_2$), sulfur hexafluoride, a hydrocarbon (generically $C_xH_y$), among others. In some embodiments that may be combined with other embodiments, the process gas may be ionized to form a plasma within the processing volume 120. For example, one or more of a carrier gas and an ionizable process gas are provided into the processing volume 120 to process the substrate 110. When processing a 300 mm substrate, the process gases are introduced to the processing chamber 100 at a flow rate from about 6500 sccm to about 8000 sccm, from about 100 sccm to about 10,000 sccm, or from about 100 sccm to about 1000 sccm. Alternatively, other flow rates may be utilized. In some examples, a remote plasma source can be used to deliver plasma to the processing chamber 100 and can be coupled to the gas supply source 111.

A showerhead 112 features openings 118 for admitting the process gas or gases into the processing volume 120 from the gas supply source 111. The process gases are supplied to the processing chamber 100 via the gas feed 114, and the process gases enter a plenum 116 prior to flowing through the openings 118. In some embodiments that may be combined with other embodiments, different process gases that are flowed simultaneously during a processing operation enter the processing chamber 100 via separate gas feeds and separate plenums prior to entering the processing volume 120 through the showerhead 112.

As illustrated, a showerhead 112 contains or serves as an electrode, and is coupled to a power source 128 through a match circuit. The power source 128 is a radio frequency (RF) power source that is electrically coupled to the electrode. Further, the power source 128 provides between about 100 Watts and about 3,000 Watts at a frequency of about 50 kHz to about 13.6 MHz. In some embodiments that may be combined with other embodiments, the power source 128 can be pulsed during various operations. The electrode and power source 128 facilitate control of a plasma formed within the processing volume 120.

The substrate support assembly 200 includes a heater 232 coupled to a power source 230 by an electric line 234, such as a metal rod or a metal wire. The substrate support assembly 200 further includes one or more coolant channel 262 coupled to a cooling circuit 260 via coolant conduits 268. In an example, a coolant, such as a mixture of water and glycol, is circulated from the cooling circuit 260 through a coolant conduit 268, then through the one or more coolant channel 262, and then back to the cooling circuit 260 via another coolant conduit 268.

The substrate support assembly 200 further includes an electrode 222 that can serve as a chucking electrode or an RF electrode. As illustrated, the electrode 222 is embedded within the substrate support assembly 200, but alternatively may be coupled to a surface of the substrate support assembly 200. The electrode 222 is coupled to a power source 220 by an electric line 224, such as a metal rod or a metal wire. It is contemplated that the power source 220 may be DC power, pulsed DC power, radio frequency (RF) power, pulsed RF power, or any combination thereof. When the electrode 222 is used as an RF electrode, the power source 220 is configured to drive the electrode 222 with a drive signal to generate a plasma within the processing volume 120. It is contemplated that the drive signal may be one of a DC signal and a varying voltage signal (e.g., RF signal). Further, the electrode 222 may alternatively be coupled to the power source 128 instead of the power source 220, and the power source 220 may be omitted.

Plasma is generated in the processing volume 120 via the power source 128 and the power source 220. An RF field is created by driving at least one of the showerhead 112 electrode and the electrode 222 with drive signals to facilitate the formation of a plasma within the processing volume 120. The presence of a plasma facilitates processing of the substrate 110, for example, the deposition of a film onto a surface of the substrate 110 or the etching of material from a surface of the substrate 110.

An exhaust port 132 is coupled to a vacuum pump 134. The vacuum pump 134 removes excess process gases or by-products from the processing volume 120 via the exhaust port 132 during and/or after processing.

In some embodiments that may be combined with other embodiments, operation of the processing chamber 100 is monitored and controlled by a controller 150. For example, the controller 150 monitors operating parameters of the processing chamber 100, such as temperatures, pressures, flow rates, and the like. The controller 150 uses the monitoring to control operations of any one or more of the gas supply source 111, the power source 128, the power source 220, the power source 230, the cooling circuit 260, or the vacuum pump 134. In some embodiments that may be combined with other embodiments, the controller 150 includes, or is operatively connected to, one or more other controllers that control any one or more of the gas supply source 111, the power source 128, the power source 220, the power source 230, the cooling circuit 260, or the vacuum pump 134.

Figure 2A:
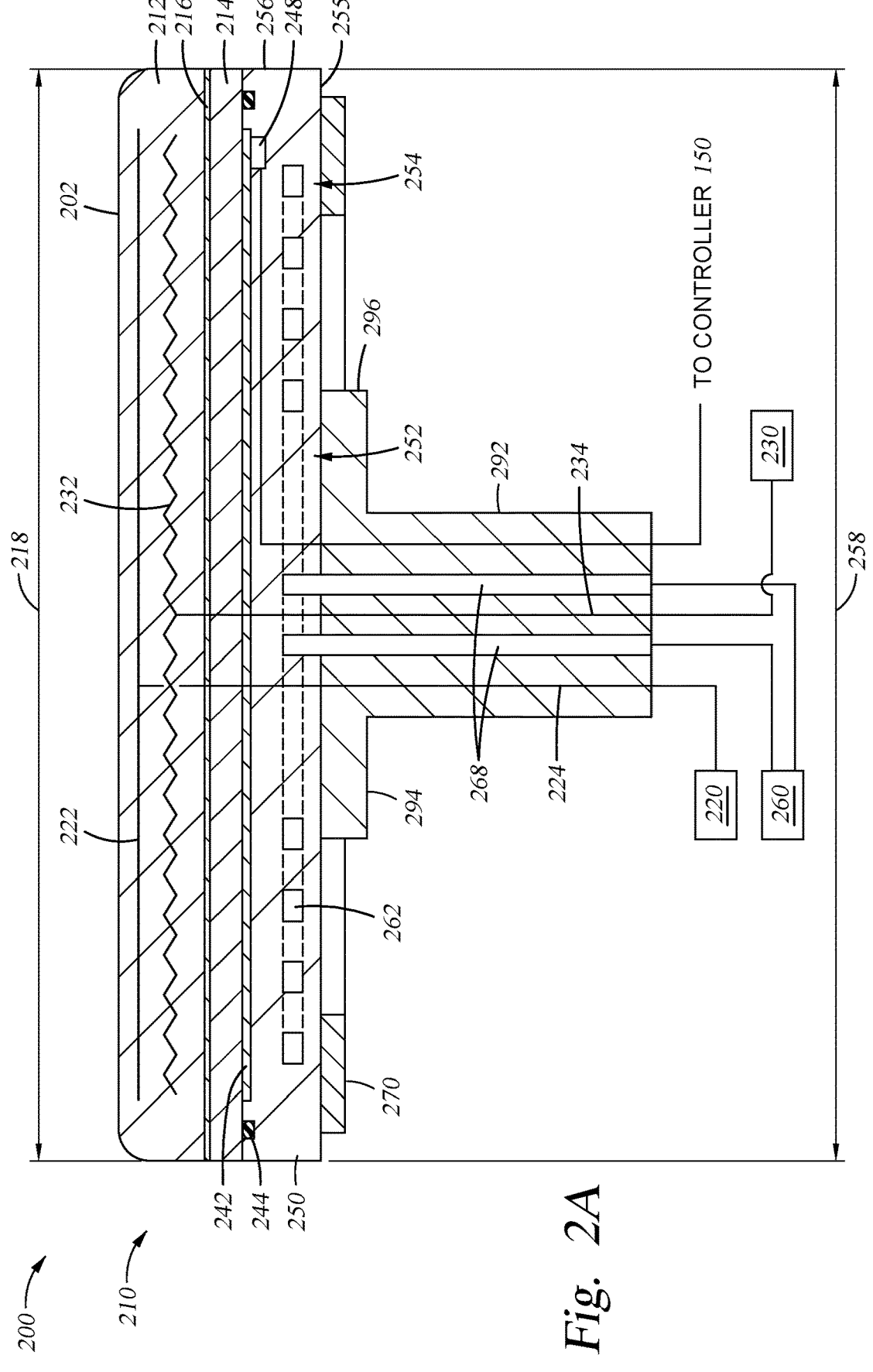
FIGS. 2A-2F schematically illustrate aspects of a substrate support assembly of the processing chamber of FIG. 1.

FIGS. 2A-2E schematically illustrate aspects of the substrate support assembly 200. FIG. 2F schematically illustrates aspects of substrate support assembly 200', a variant of the substrate support assembly 200. FIG. 2A shows a puck assembly 210 mounted on a cooling plate 250. As illustrated, in some embodiments that may be combined with other embodiments, the puck assembly 210 includes a top puck 212 bonded to a bottom puck 214. In some embodiments that may be combined with other embodiments, the puck assembly 210 includes one or more additional pucks. The top puck 212 and the bottom puck 214 contain, or are formed from, one or more ceramic materials. Exemplary ceramic materials include one or more metal oxides, metal nitrides, metal oxynitrides, or any combination thereof. For example, the top puck 212 and the bottom puck 214 may contain, or be formed from, aluminum oxide, aluminum nitride, aluminum oxynitride, or any combination thereof. In some embodiments that may be combined with other embodiments, the top puck 212 is bonded to the bottom puck 214 via a bonding sheet 216. In an example, the bonding sheet 216 contains, or is formed from, a metallic material, such as aluminum.

As illustrated, the electrode 222 and the heater 232 are embedded within the top puck 212. In some embodiments that may be combined with other embodiments, at least a portion of the electrode 222 is above the heater 232. In some embodiments that may be combined with other embodiments, at least a portion of the electrode 222 is below the heater 232. In some embodiments that may be combined with other embodiments, at least a portion of the electrode 222 is in the same horizontal plane as the heater 232.

The bottom puck 214 is mounted on the cooling plate 250. The cooling plate contains, or is formed from, a metal, such as aluminum, a stainless steel, or the like. In some embodiments that may be combined with other embodiments, an outer rim 256 of the cooling plate 250 is anodized. A seal 244, such as an elastomer, at an interface between the bottom puck 214 and the cooling plate 250 hinders fluid ingress between the bottom puck 214 and the cooling plate 250. In some embodiments that may be combined with other embodiments, the seal 244 is plasma-resistant. The cooling plate 250 includes the one or more coolant channel 262, described above.

A thermal choke layer 242 is disposed between the bottom puck 214 and the cooling plate 250. The thermal choke layer 242 includes a thermal choke material. In some embodiments that may be combined with other embodiments, the thermal choke material is present in the form of one or more sheets. Exemplary thermal choke materials include a polymer (such as a fluoropolymer), a metal, graphene, or any combination thereof. In an example, the thermal choke layer 242 includes one or more polymer sheets and one or more graphene sheets. For instance, the one or more graphene sheets may be stacked on top of, may be stacked beneath, or may be interleaved with the one or more polymer sheets. In another example, the thermal choke layer 242 includes one or more metallic sheets that are coated with a polymer. For instance, thermal choke layer 242 may include one or more sheets of aluminum that are coated with a polymer, such as polytetrafluoroethylene (PTFE) or the like.

In some embodiments that may be combined with other embodiments, the thermal choke layer 242 has a thermal conductivity in a direction perpendicular to a plane of the thermal choke layer 242 of from 0.05 to 5 W/(m·K), such as 0.05 to 3, 0.1 to 3, or 0.1 to 2 W/(m·K). In some embodiments that may be combined with other embodiments, the thermal choke layer 242 has a thermal conductivity in a direction perpendicular to a plane of the thermal choke layer 242 that is greater than a thermal conductivity of the bottom puck 214. In some embodiments that may be combined with other embodiments, the thermal choke layer 242 has a thermal conductivity in a direction perpendicular to a plane of the thermal choke layer 242 that is less than or equal to a thermal conductivity of the bottom puck 214. In some embodiments that may be combined with other embodiments, the thermal choke layer 242 has a thermal conductivity in a direction perpendicular to a plane of the thermal choke layer 242 that is greater than a thermal conductivity of the cooling plate 250. In some embodiments that may be combined with other embodiments, the thermal choke layer 242 has a thermal conductivity in a direction perpendicular to a plane of the thermal choke layer 242 that is less than or equal to a thermal conductivity of the cooling plate 250.

The substrate support assembly 200 includes a shaft 292 and a platen 294. The platen 294 extends perpendicularly from the shaft 292 at an upper end of the shaft 292. In some embodiments that may be combined with other embodiments, the shaft 292 and platen 294 are in the form of a unitary structure. In other embodiments, the platen 294 is affixed to the shaft 292. In some embodiments that may be combined with other embodiments, the shaft 292 contains, or is formed from, a metal, such as aluminum, a stainless steel, or the like. In some embodiments that may be combined with other embodiments, the platen 294 contains, or is formed from, a metal, such as aluminum, a stainless steel, or the like. The coolant conduits 268 and electric lines 224, 234 are routed through the shaft 292 and the platen 294.

A first portion 252 of the cooling plate 250 is coupled to the platen 294, such as by fasteners, such as bolts, screws, threaded rods, nuts, or the like. A second portion 254 of the cooling plate 250 extends beyond an outer rim 296 of the platen 294. The one or more coolant channel 262 is fluidically coupled to the coolant conduits 268 at the first portion 252. At least one coolant channel 262 extends from the first portion 252 into the second portion 254.

Figure 2B:
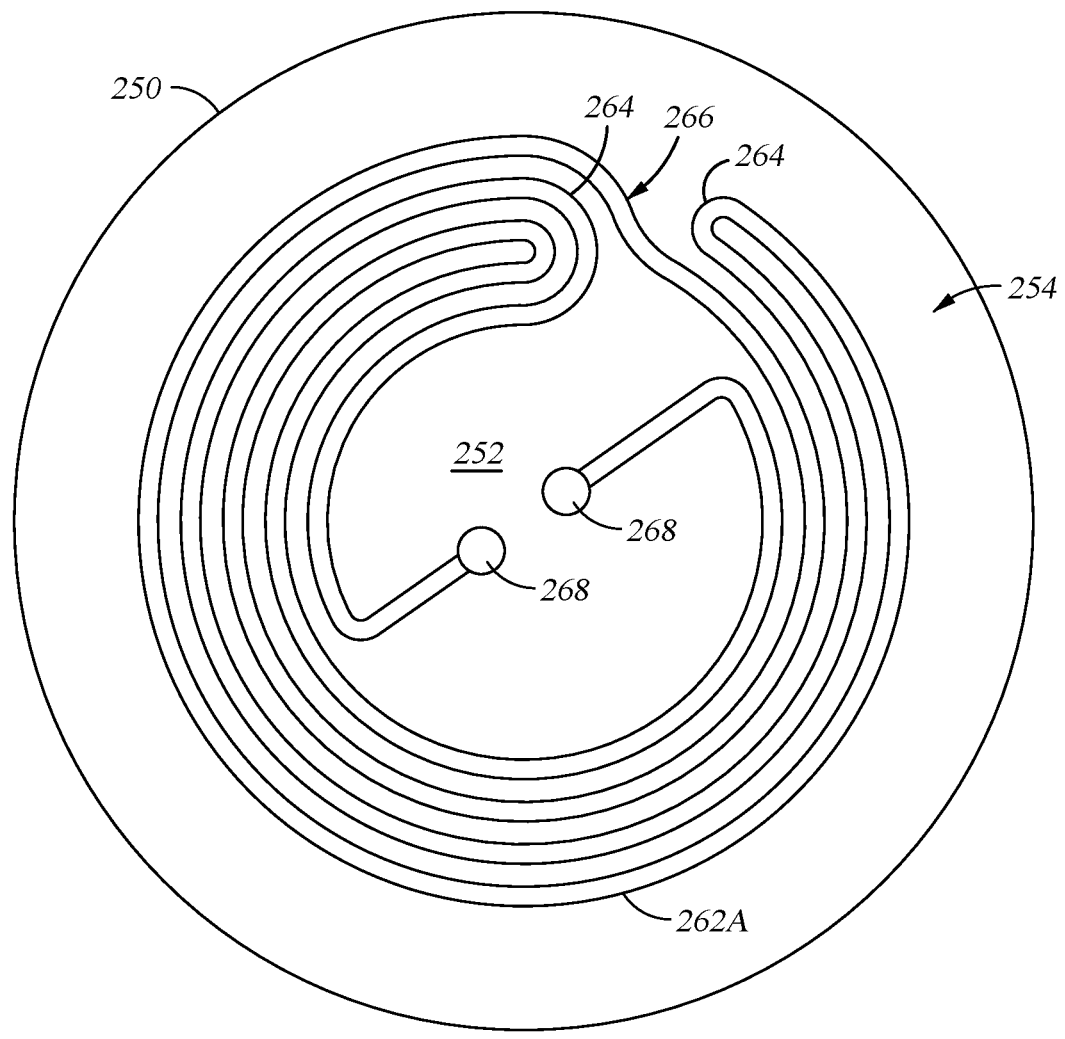
Figure 2C:
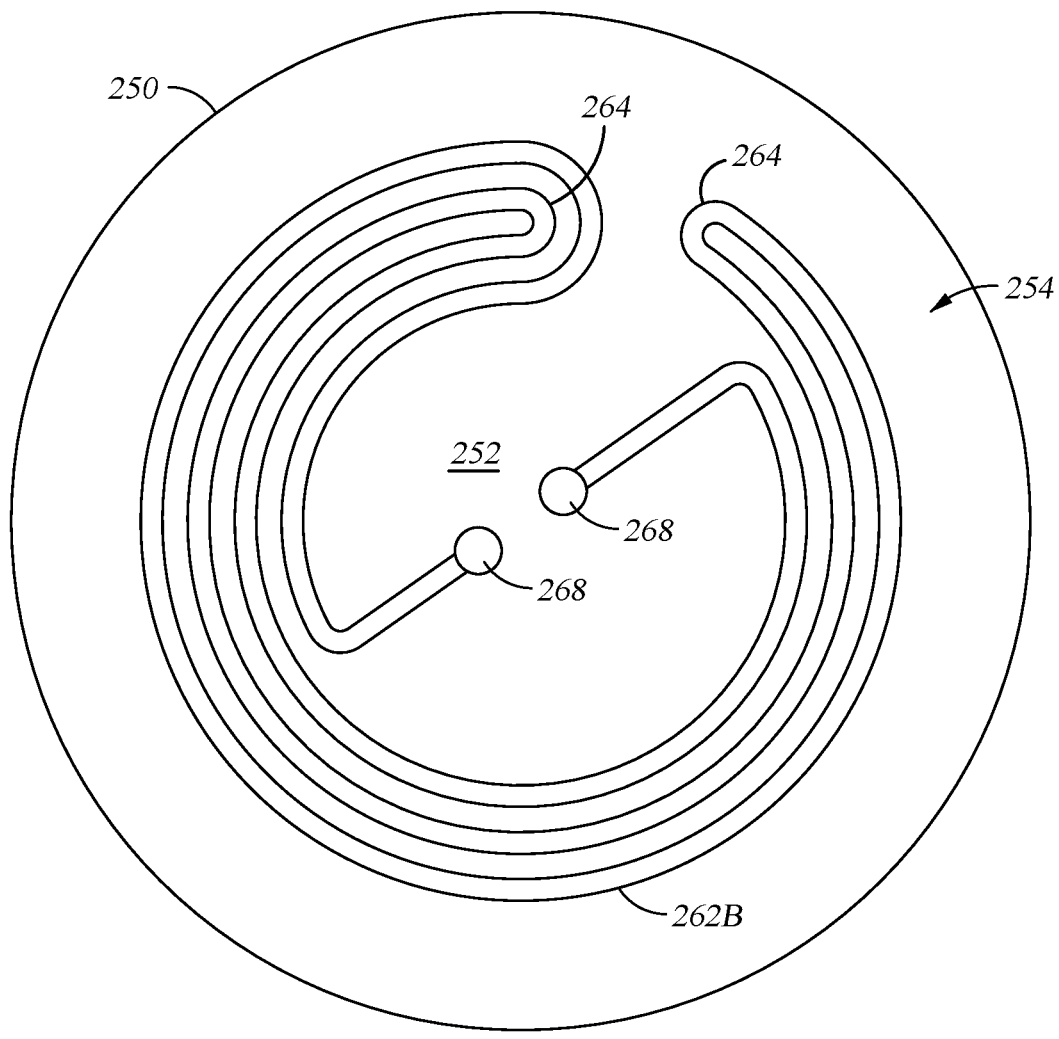

FIGS. 2B and 2C schematically illustrate exemplary pathways of a coolant channel 262 in the cooling plate 250. In FIG. 2B, the coolant channel 262 is represented by coolant channel 262A. The coolant channel 262A is fluidically coupled to the coolant conduits 268 at the first portion 252 of the cooling plate 250, and extends into the second portion 254 of the cooling plate 250. The coolant channel 262A defines a pathway including a plurality of loops 264. As illustrated, at least one loop 264 doubles-back. As illustrated, at least one loop 264 doubles-back by a 180 degree turn such that portions of the pathway beyond the loop 264 run parallel to each other. Additionally, the pathway of the coolant channel 262A includes a portion 266 that circumnavigates the cooling plate 250 about the coolant conduits 268.

In FIG. 2C, the coolant channel 262 is represented by coolant channel 262B. The coolant channel 262B is fluidically coupled to the coolant conduits 268 at the first portion 252 of the cooling plate 250, and extends into the second portion 254 of the cooling plate 250. The coolant channel 262B defines a pathway including a plurality of loops 264. As illustrated, at least one loop 264 doubles-back. As illustrated, at least one loop 264 doubles-back by a 180 degree turn such that portions of the pathway beyond the loop 264 run parallel to each other. In the illustrated example, the pathway of the coolant channel 262B does not include a portion that circumnavigates the cooling plate 250 about the coolant conduits 268.

Returning to FIG. 2A, in some embodiments that may be combined with other embodiments, as illustrated, the substrate support assembly 200 includes one or more temperature sensor 248. In some embodiments that may be combined with other embodiments, each temperature sensor 248 of a plurality of temperature sensors 248 is positioned at a different location within the substrate support assembly 200 to monitor the uniformity of the temperature of the substrate support assembly 200 across a lateral extent of the substrate support assembly 200. As illustrated, in some embodiments that may be combined with other embodiments, at least one temperature sensor 248 is positioned at the interface of the cooling plate 250 and the bottom puck 214, such as just below the thermal choke layer 242.

Additionally, or alternatively, in some embodiments that may be combined with other embodiments, at least one temperature sensor 248 is positioned within the puck assembly 210. In an example, each temperature sensor 248 of a plurality of temperature sensors 248 is positioned at a different location within the puck assembly 210 to monitor the uniformity of the temperature of the puck assembly 210 across a lateral extent of the puck assembly 201.

The one or more temperature sensor 248 is coupled to the controller 150. The controller 150 uses readings from the one or more temperature sensor 248 in the control of operations of the processing chamber 100. Nevertheless, in some embodiments that may be combined with other embodiments, the one or more temperature sensor 248 is omitted.

As illustrated, in some embodiments that may be combined with other embodiments, an outer diameter 218 of the puck assembly 210 is substantially equal to an outer diameter 258 of the cooling plate 250. For example, the outer diameter 218 of the puck assembly 210 may be 98-102% of the outer diameter 258 of the cooling plate 250. In some embodiments that may be combined with other embodiments, the outer diameter 218 of the puck assembly 210 may not be substantially equal to the outer diameter 258 of the cooling plate 250. In an example, the outer diameter 218 of the puck assembly 210 may be less than 98% of the outer diameter 258 of the cooling plate 250. In another example, the outer diameter 218 of the puck assembly 210 may be greater than 102% of the outer diameter 258 of the cooling plate 250.

The substrate support assembly 200 includes a clamp ring 270 mounted to an underside 255 of the cooling plate 250. The clamp ring 270 encircles the platen 294, and is used to secure the puck assembly 210 to the cooling plate 250, as described below. In some embodiments that may be combined with other embodiments, the clamp ring 270 is a unitary structure. In some embodiments that may be combined with other embodiments, the clamp ring 270 includes two or more separate ring portions that are arranged around the platen 294.

In some embodiments that may be combined with other embodiments, the clamp ring 270 contains, or is formed from, a metal, such as aluminum, a stainless steel, or the like. In some of such embodiments the clamp ring 270 is anodized. In other embodiments, the clamp ring 270 is not anodized. In some embodiments that may be combined with other embodiments, the clamp ring 270 contains, or is formed from, one or more ceramic materials. Exemplary ceramic materials include one or more metal oxides, metal nitrides, metal oxynitrides, or any combination thereof. For example, the clamp ring 270 may contain, or be formed from, aluminum oxide, aluminum nitride, aluminum oxynitride, or any combination thereof. In some embodiments that may be combined with other embodiments, the clamp ring 270 contains, or is formed from, a polymeric material, such as PTFE or the like. In some embodiments that may be combined with other embodiments, the clamp ring 270 is coated with a polymeric material, such as PTFE, a perfluoroelastomer, or the like.

Figure 2D:
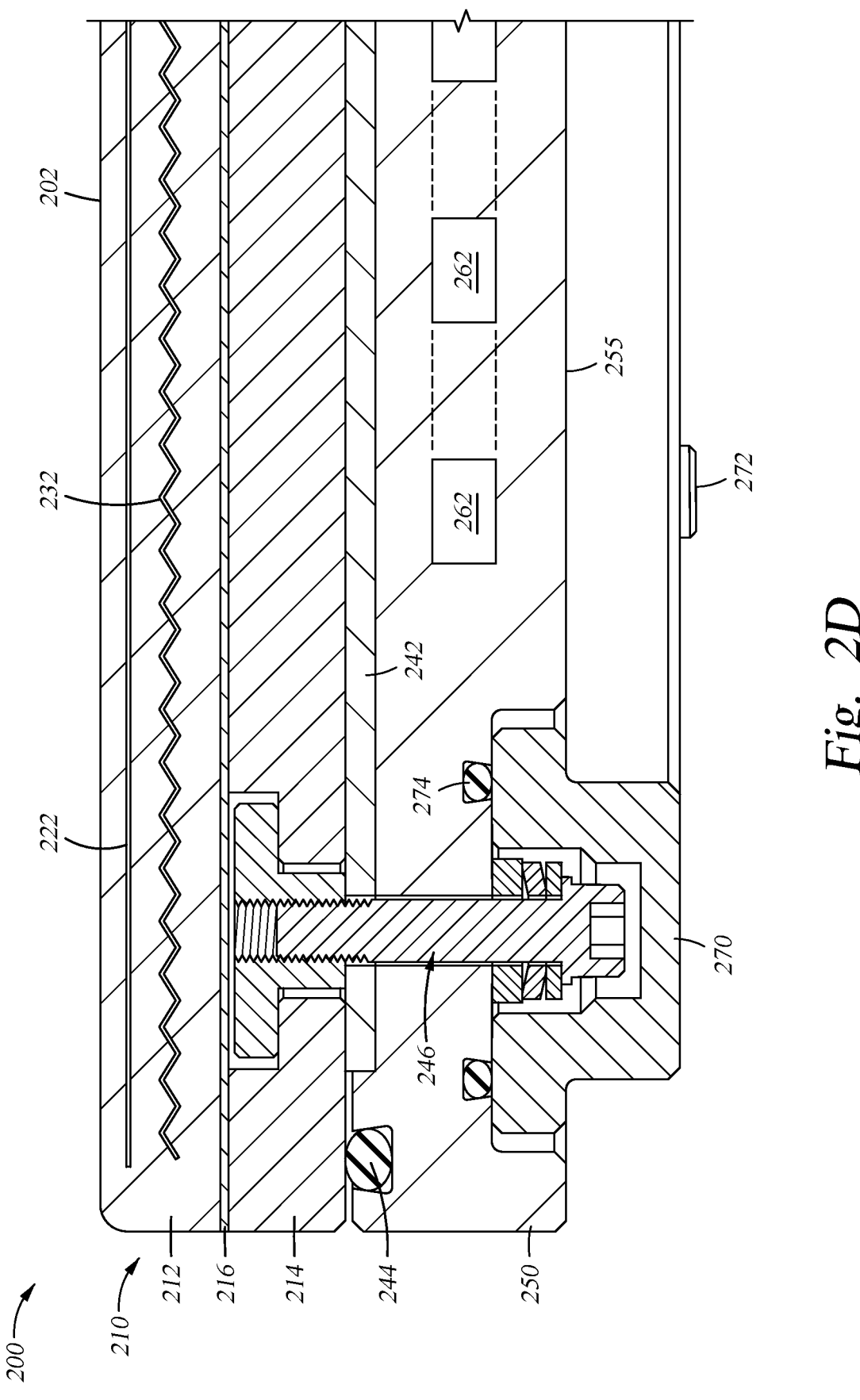
Figure 2E:
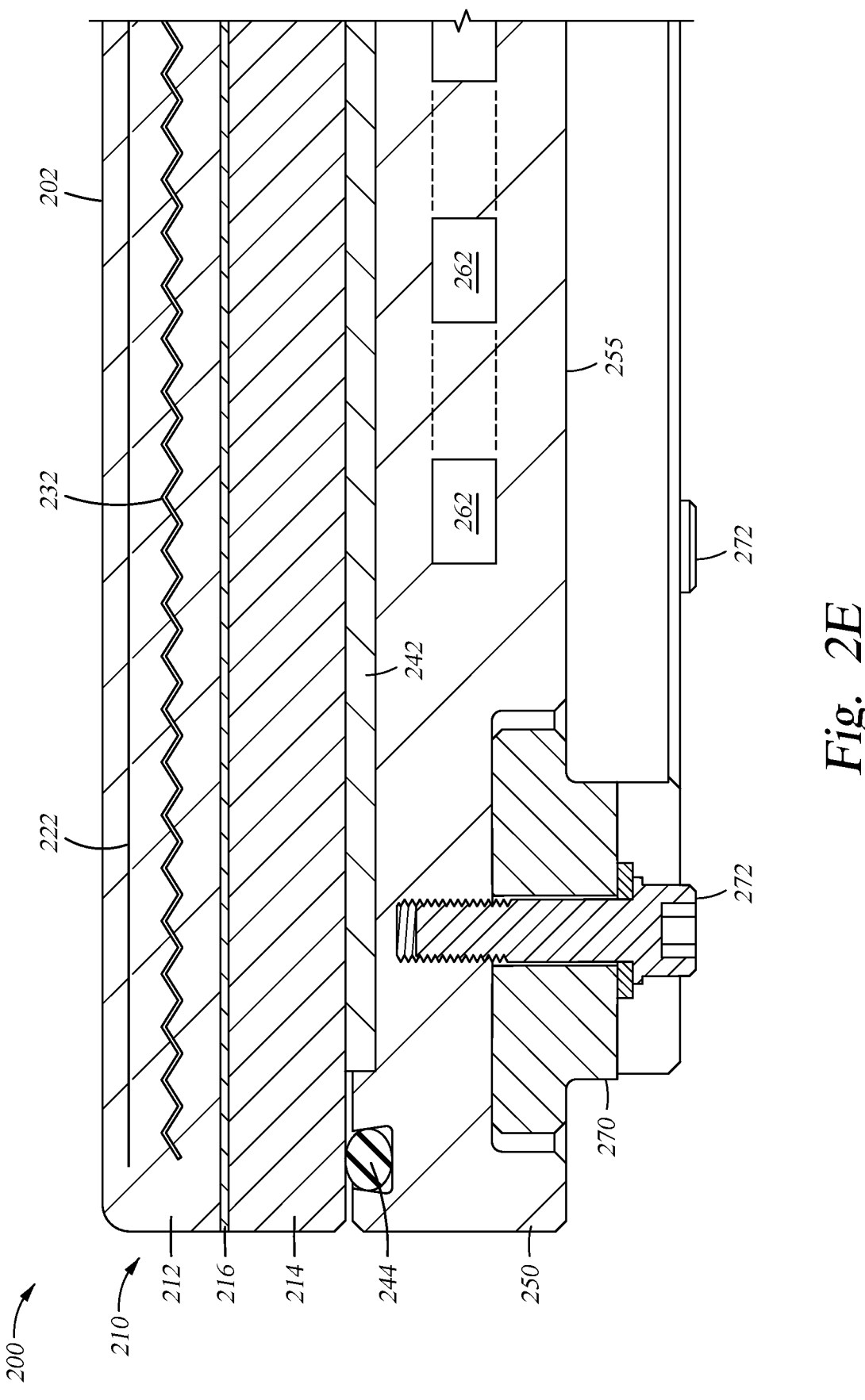
Figure 2F:
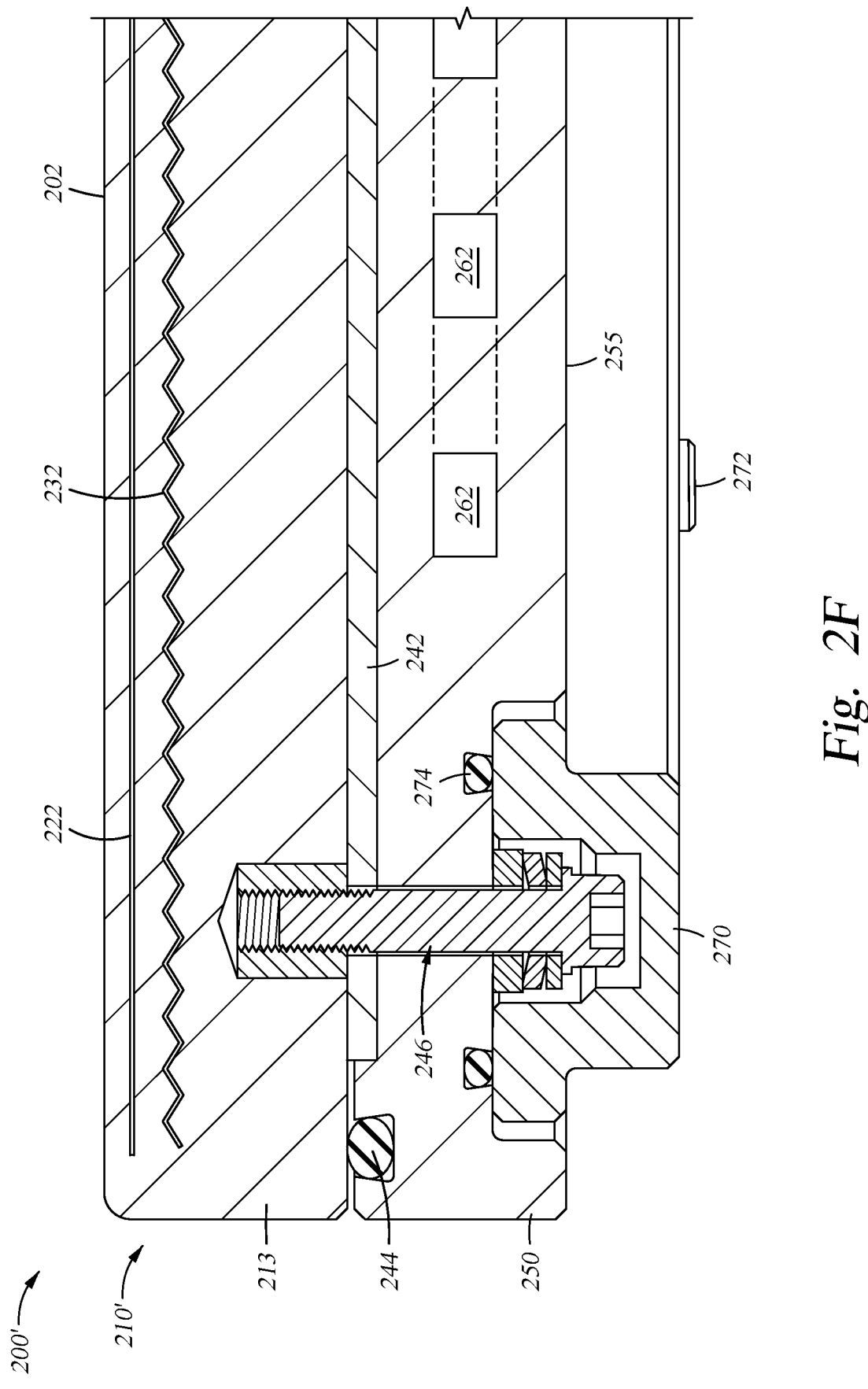

FIGS. 2D and 2E schematically illustrate a portion of the substrate support assembly 200, focusing on the securing of the puck assembly 210 to the cooling plate 250. The bottom puck 214 is engaged by a plurality of fasteners 246, such as bolts, screws, threaded rods, nuts, or the like. The plurality of fasteners 246 pass through the cooling plate 250, and are tightened against the underside 255 of the cooling plate 250. The clamp ring 270 covers the plurality of fasteners 246. A seal 274, such as an elastomer, at an interface between the clamp ring 270 and the cooling plate 250 hinders fluid ingress between the clamp ring 270 and the cooling plate

250. In some embodiments that may be combined with other embodiments, the seal 274 is plasma-resistant.

The clamp ring 270 is mounted to the underside 255 of the cooling plate 250 by a plurality of fasteners 272, such as bolts, screws, threaded rods, nuts, or the like. In some embodiments that may be combined with other embodiments, each fastener 272 is made of a metal, such as a steel, such as a stainless steel, or the like. In some embodiments that may be combined with other embodiments, each fastener 272 is coated with a chemical- and/or plasma-resistant material, such as an elastomer, such as a perfluoroelastomer, or the like.

FIG. 2F schematically illustrates aspects of the substrate support assembly 200'. The substrate support assembly 200' is a variant of the substrate support assembly 200 that may be utilized in place of the substrate support assembly 200. The substrate support assembly 200' includes puck assembly 210' instead of the puck assembly 210. The puck assembly 210' features a unitary puck 213 in place of the combination of the top puck 212, bottom puck 214, and bonding sheet 216. As illustrated, in some embodiments that may be combined with other embodiments, the electrode 222 may be embedded within the unitary puck 213. As illustrated, in some embodiments that may be combined with other embodiments, the heater 232 may be embedded within the unitary puck 213. The puck assembly 210' is coupled to the cooling plate 250 by the fasteners 246, and the clamp ring 270 is mounted to the underside 255 of the cooling plate 250 by the fasteners 272, as described above.

In some embodiments that may be combined with other embodiments, the substrate support assembly 200 can be dismantled and reconfigured. For example, the cooling plate 250 can be removed from, and replaced onto, the platen 294. Additionally, or alternatively, the puck assembly 210/210' can be removed from, and replaced onto, the cooling plate 250. For instance, a puck assembly 210/210' may be replaced by another puck assembly 210/210' that incorporates a different arrangement of heater 232 or electrode 222. Moreover, a puck assembly configured as one of puck assembly 210 or 210' may be replaced by a puck assembly configured as the other of puck assembly 210 or 210'. Furthermore, the thermal choke layer 242 can be removed from, and replaced into, the substrate support assembly 200. In another example, a cooling plate 250 incorporating a particular configuration of coolant channel 262 (such as one of the coolant channels 262A or 262B) may be replaced by another cooling plate 250 incorporating a different configuration of coolant channel 262 (such as the other of the coolant channels 262A or 262B).

Figure 3:
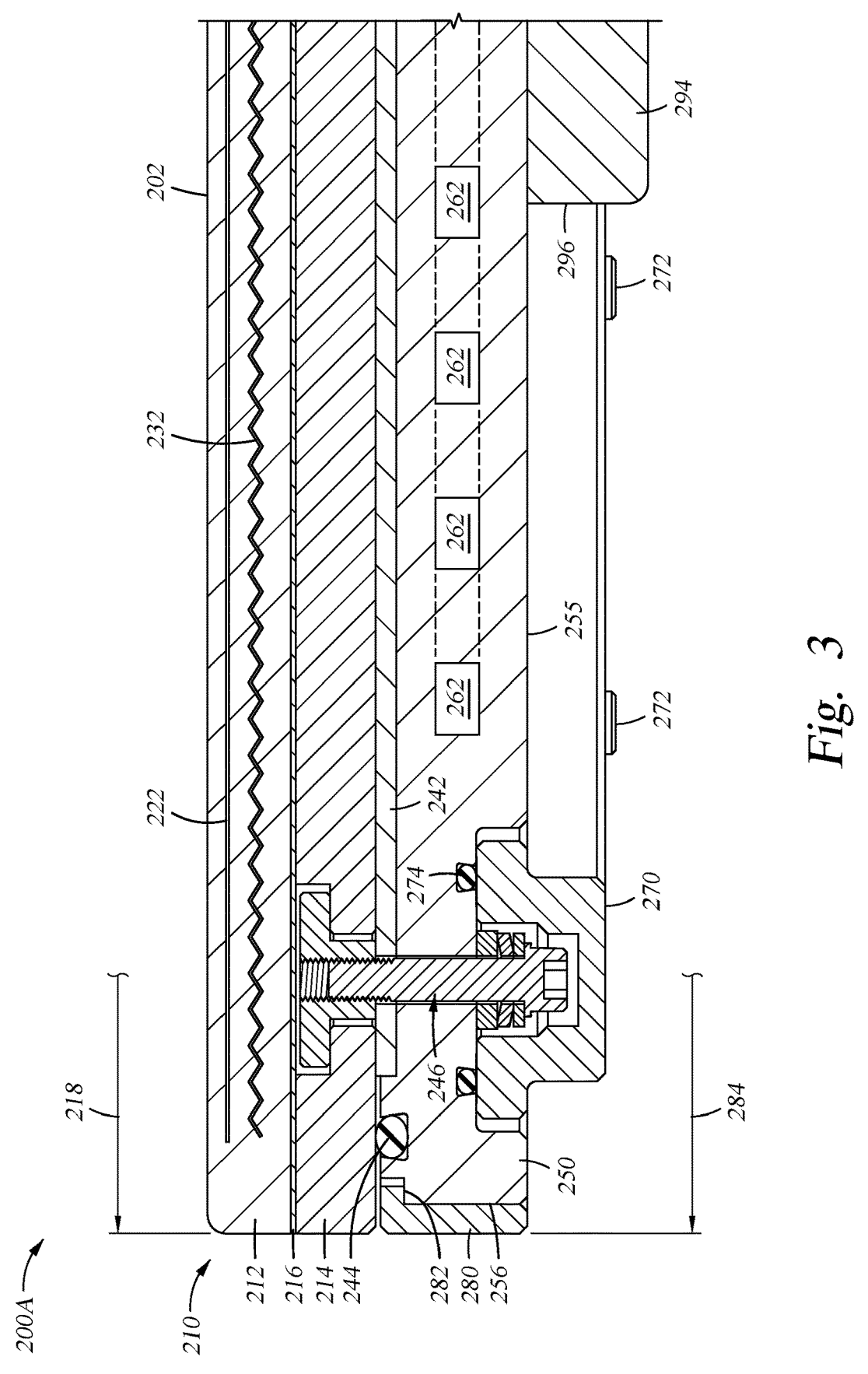
FIG. 3 schematically illustrates a portion of another embodiment of the substrate support assembly of FIGS. 2A-2F.

FIG. 3 is a view similar to that of FIG. 2D, and schematically illustrates a variation of the substrate support assembly 200. In FIG. 3, the substrate support assembly 200 is represented by substrate support assembly 200A. Substrate support assembly 200A is similar to substrate support assembly 200, but includes a skirt 280 surrounding the outer rim 256 of the cooling plate 250.

In some embodiments that may be combined with other embodiments, the skirt 280 contains, or is formed from, one or more ceramic materials. Exemplary ceramic materials include one or more metal oxides, metal nitrides, metal oxynitrides, or any combination thereof. For example, the skirt 280 may contain, or be formed from, aluminum oxide, aluminum nitride, aluminum oxynitride, or any combination thereof. In some embodiments that may be combined with other embodiments, the skirt 280 contains, or is formed from, a metal, such as aluminum, a stainless steel, or the like. In some of such embodiments the skirt 280 is anodized. In other embodiments, the skirt 280 is not anodized. In some embodiments that may be combined with other embodiments, the skirt 280 contains, or is formed from, a polymeric material, such as PTFE, a perfluoroelastomer, or the like. In some embodiments that may be combined with other embodiments, the skirt 280 is coated with a polymeric material, such as PTFE, a perfluoroelastomer, or the like.

As illustrated, in some embodiments that may be combined with other embodiments, the skirt 280 includes a lip 282 disposed between the cooling plate 250 and the puck assembly 210. As shown, the lip 282 is disposed between the cooling plate 250 and the bottom puck 214. Further as shown, in some embodiments that may be combined with other embodiments, the skirt 282 is a separate component from the bottom puck 214. However, in some embodiments that may be combined with other embodiments, the skirt 280 is integrally formed with a puck of the puck assembly 210, such as the top puck 212 or the bottom puck 214.

As illustrated, in some embodiments that may be combined with other embodiments, the skirt 280 extends to a location level with the underside 255 of the cooling plate 250. Alternatively, in some embodiments that may be combined with other embodiments, the skirt 280 extends to a location above a level of the underside 255 of the cooling plate 250. However, in some embodiments that may be combined with other embodiments, the skirt 280 extends to a location below a level of the underside 255 of the cooling plate 250.

As illustrated, in some embodiments that may be combined with other embodiments, an outer diameter 284 of the skirt 280 is substantially equal to the outer diameter 218 of the puck assembly 210. For example, the outer diameter 284 of the skirt 280 may be 98-102% of the outer diameter 218 of the puck assembly 210. In some embodiments that may be combined with other embodiments, the outer diameter 284 of the skirt 280 may not be substantially equal to the outer diameter 218 of the puck assembly 210. In an example, the outer diameter 284 of the skirt 280 may be less than 98% of the outer diameter 218 of the puck assembly 210. In another example, the outer diameter 284 of the skirt 280 may be greater than 102% of the outer diameter 218 of the puck assembly 210.

In some embodiments that may be combined with other embodiments, the puck assembly 210' is utilized instead of the puck assembly 210 in substrate support assembly 200A. In some of such embodiments, the skirt 280 is integrally formed with the puck 213 of the puck assembly 210'. In other embodiments, the skirt 280 is a separate component from the puck assembly 210'.

Figure 4:
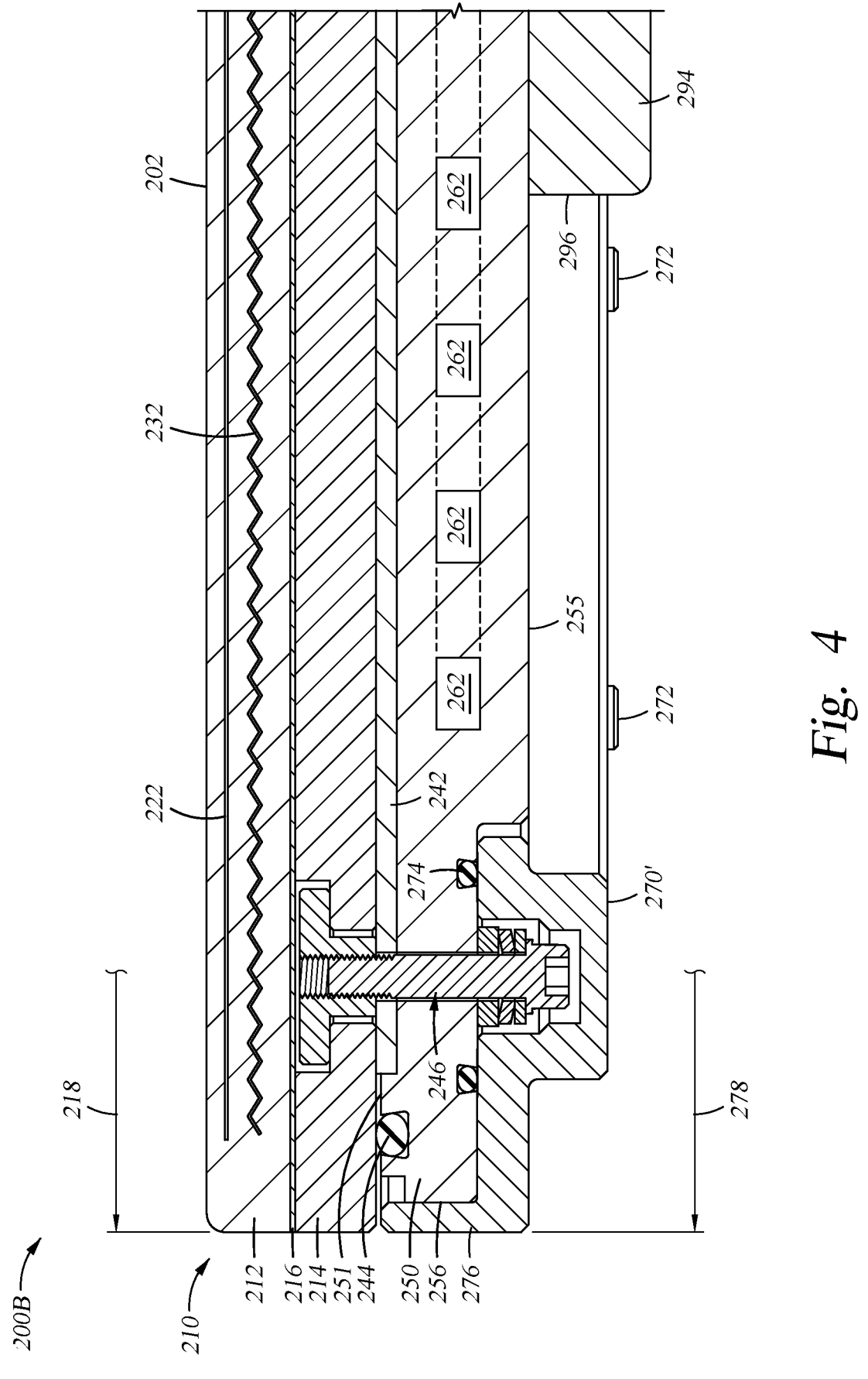
FIG. 4 schematically illustrates a portion of another embodiment of the substrate support assembly of FIGS. 2A-2F.

FIG. 4 is a view similar to that of FIG. 2D, and schematically illustrates a variation of the substrate support assembly 200. In FIG. 4, the substrate support assembly 200 is represented by substrate support assembly 200B. Substrate support assembly 200B includes the features of substrate support assembly 200, and includes one or more additional features, described below.

In the substrate support assembly 200B, the clamp ring 270 is represented by clamp ring 270'. The clamp ring 270' includes a skirt 276 surrounding the outer rim 256 of the cooling plate 250. As illustrated, in some embodiments that may be combined with other embodiments, an outer diameter 278 of the skirt 276 is substantially equal to the outer diameter 218 of the puck assembly 210. For example, the outer diameter 278 of the skirt 276 may be 98-102% of the outer diameter 218 of the puck assembly 210. In some embodiments that may be combined with other embodiments, the outer diameter 278 of the skirt 276 may not be substantially equal to the outer diameter 218 of the puck assembly 210. In an example, the outer diameter 278 of the skirt 276 may be less than 98% of the outer diameter 218 of the puck assembly 210. In another example, the outer diameter 278 of the skirt 276 may be greater than 102% of the outer diameter 218 of the puck assembly 210.

In some embodiments that may be combined with other embodiments, the clamp ring 270' contains, or is formed from, one or more ceramic materials. Exemplary ceramic materials include one or more metal oxides, metal nitrides, metal oxynitrides, or any combination thereof. For example, the clamp ring 270' may contain, or be formed from, aluminum oxide, aluminum nitride, aluminum oxynitride, or any combination thereof. In some embodiments that may be combined with other embodiments, the clamp ring 270' contains, or is formed from, a metal, such as aluminum, a stainless steel, or the like. In some of such embodiments the clamp ring 270' is anodized. In other embodiments, the clamp ring 270' is not anodized. In some embodiments that may be combined with other embodiments, the clamp ring 270' contains, or is formed from, a polymeric material, such as PTFE or the like. In some embodiments that may be combined with other embodiments, the clamp ring 270' is coated with a polymeric material, such as PTFE, a perfluoroelastomer, or the like.

As illustrated, in some embodiments that may be combined with other embodiments, the skirt 276 extends to a location level with the top surface 251 of the cooling plate 250. Alternatively, in some embodiments that may be combined with other embodiments, the skirt 276 extends to a location above a level of the top surface 251 of the cooling plate 250. However, in some embodiments that may be combined with other embodiments, the skirt 276 extends to a location below a level of the top surface 251 of the cooling plate 250.

In some embodiments that may be combined with other embodiments, the puck assembly 210' is utilized instead of the puck assembly 210 in substrate support assembly 200B.

Figure 5:
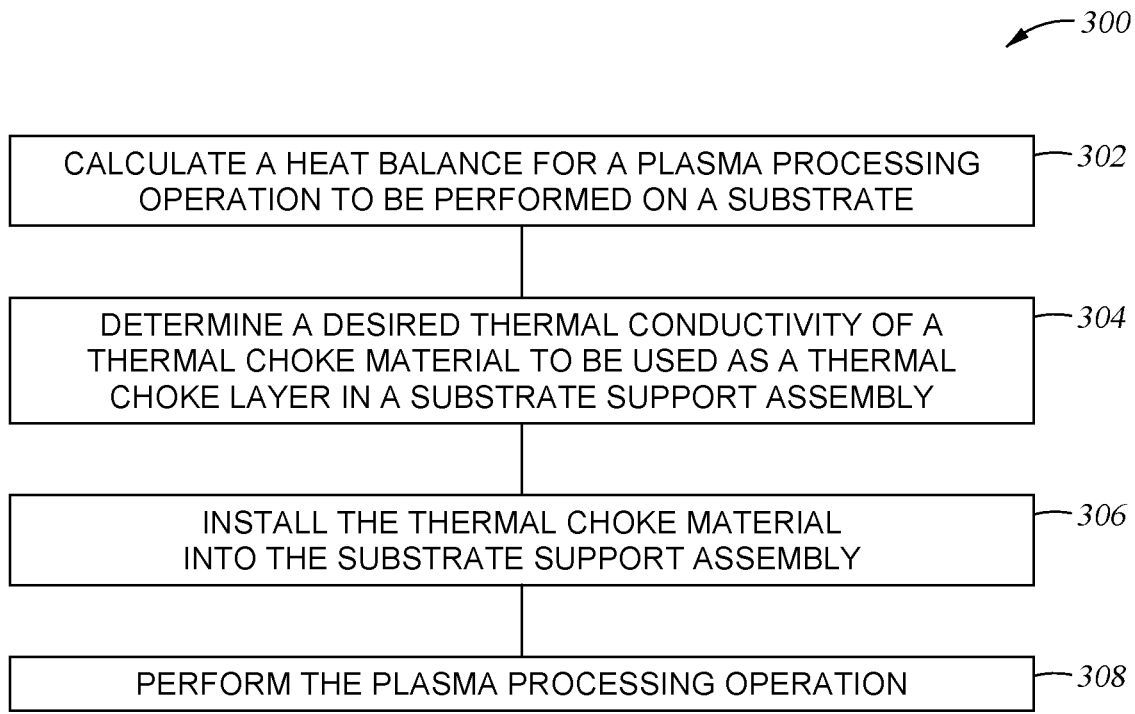
FIG. 5 is a flow diagram providing a method of executing a plasma processing operation.

FIG. 5 is a flow diagram providing a method 300 of executing a plasma processing operation. It is contemplated that the method 300 may be conducted in the processing chamber 100. It is contemplated that the method 300 may be performed in another processing chamber that is configured to perform plasma processing operations. It is further contemplated that the method 300 may be performed in a processing chamber, such as processing chamber 100 or the like, that includes a substrate support assembly that is configured similarly to any one of the substrate support assemblies 200, 200A, or 200B.

At operation 302, a heat balance is calculated for a plasma processing operation to be performed on a substrate, such as substrate 110. The heat balance includes inputs such as a desired processing temperature of the substrate, the heat output of a heater (such as heater 232 or the like), and the required power output(s) of the RF power source(s) (such as power source 128, power source 220, or the like). In some embodiments that may be combined with other embodiments, the heat balance also includes estimations of heat loss from the processing volume (such as processing volume 120) of the processing chamber, such as through the chamber body 102 and the lid 106. In some embodiments that may be combined with other embodiments, the heat balance further includes estimations of heat loss from the substrate due to conduction, radiation, and/or convection.

The heat balance provides an estimate of the heat applied to the substrate, such as by the plasma, net of at least one of the above heat losses. In some embodiments that may be combined with other embodiments, the heat balance also provides an estimate of the temperature rise of the substrate beyond the desired processing temperature of the substrate. In some embodiments that may be combined with other embodiments, the heat balance simulates one or more scenarios in which the power supplied to the heater, such as from power source 230 is adjusted. In some embodiments that may be combined with other embodiments, the heat balance simulates one or more scenarios in which the flowrate and/or temperature of coolant flowing through the coolant channels 262/262A/262B is adjusted.

At operation 304, a determination is made of a desired thermal conductivity of a thermal choke material to be used as a thermal choke layer in the substrate support assembly, as such substrate support assembly 200/200'/200A/200B. The desired thermal conductivity of a thermal choke material is determined according to one or more target parameters, such as the desired maximum and minimum substrate temperatures, the desired degree of temperature variation across the substrate, or the desired duration of the plasma processing operation.

One or more thermal choke materials are selected according to the determination made at operation 304. A thermal conductivity of the one or more thermal choke materials corresponds to the desired thermal conductivity. The selected one or more thermal choke materials are installed into the substrate support assembly at operation 306. Then the plasma processing operation is performed at operation 308.

In some embodiments that may be combined with other embodiments, operation 308 includes simultaneously heating the substrate using the heater of the substrate support assembly, and flowing a coolant through the substrate support assembly (such as through the coolant channels 262/262A/262B of the cooling plate 250). In some embodiments that may be combined with other embodiments, operation 308 includes monitoring a temperature of a puck assembly of the substrate support assembly during the plasma processing operation. In an example, the temperature of the puck assembly is monitored using the at least one temperature sensor 248. In some embodiments that may be combined with other embodiments, operation 308 includes adjusting a flowrate of the coolant during the plasma processing operation in response to monitoring the temperature of the puck assembly.

In some embodiments that may be combined with other embodiments, operation 308 includes performing an entirety of the plasma processing operation while maintaining power to the heater and while maintaining the temperature of a puck assembly of the substrate support assembly within a prescribed tolerance range of a target temperature. In some embodiments that may be combined with other embodiments, the target temperature is 300° C. or less, such as 280° C. or less, 260° C. or less, 250° C. or less, 240° C. or less, 230° C. or less, 220° C. or less, 210° C. or less, or 200° C. or less. In an example, the prescribed tolerance range is 98% to 102% of the target temperature, such that, for illustration, if the target temperature is 200° C., the prescribed tolerance range is 196° C. to 204° C. In another example, the prescribed tolerance range is 98.5% to 101.5%, such as 99% to 101%, 99.5% to 100.5%, or 99.7% to 100.3% of the target temperature.

In some embodiments that may be combined with other embodiments, operation 308 includes performing an entirety of the plasma processing operation while maintaining power to the heater and while regulating a temperature gradient across a puck assembly of the substrate support assembly. In an example, regulating the temperature gradient across the puck assembly includes maintaining a uniformity of the temperature of the puck assembly across a lateral extent of the puck assembly within a prescribed uniformity tolerance range of the target temperature. In an example, the prescribed uniformity tolerance range is 98% to 102% of the target temperature, such that, for illustration, if the target temperature is 200° C., the prescribed uniformity tolerance range is 196° C. to 204° C. In another example, the prescribed uniformity tolerance range is 98.5% to 101.5%, such as 99% to 101%, 99.5% to 100.5%, or 99.7% to 100.3% of the target temperature.

In some embodiments that may be combined with other embodiments, operation 308 is controlled by the controller 150 (FIG. 1). It is contemplated that the controller 150 includes a central processing unit (CPU), a memory containing instructions, and support circuits for the CPU. The controller 150 is of any form of a general-purpose computer processor that is used in an industrial setting for controlling various chambers and equipment and/or sub-processors thereon or therein.

The memory, or non-transitory computer readable medium, is one or more of a readily available memory such as random access memory (RAM), read only memory (ROM), floppy disk, hard disk, flash drive, or any other form of digital storage, local or remote. The support circuits are coupled to the CPU for supporting the CPU (a processor). The support circuits include cache, power supplies, clock circuits, input/output circuitry and subsystems, and the like. Operations and operating parameters are stored in the memory as a software routine that is executed or invoked to turn the controller 150 into a specific purpose controller to control the operations of the processing chamber 100, as described above. The controller 150 can be configured to conduct any of the operations described herein. The instructions stored on the memory, when executed, cause one or more of the operations described herein to be conducted.

In some embodiments that may be combined with other embodiments, data from any sensor associated with the processing chamber 100 (such as the one or more temperature sensor 248) may be used to provide feedback to the controller 150. In some embodiments that may be combined with other embodiments, data of electrical current through the heater 232 may be used to provide feedback to the controller 150. The controller 150 uses the data so provided as an input to adjust the temperature of the puck assembly 210/210' and/or the uniformity of the temperature of the puck assembly 210/210' across the puck assembly 210/210' by controlling operations of any one or more of the gas supply source 111, the power source 128, the power source 220, the power source 230, the cooling circuit 260, or the vacuum pump 134.

The instructions in the memory of the controller 150 can include one or more machine learning/artificial intelligence algorithms that can be executed in addition to the operations described herein. As an example, a machine learning/artificial intelligence algorithm executed by the controller 150 can optimize and alter operational parameters based on one or more sensor measurements taken by any sensor associated with the processing chamber 100 (such as the one or more temperature sensor 248). The operational parameters can include, for example, coolant pressure, coolant inlet/outlet temperature, coolant flow rate, and heater 232 current.

The one or more machine learning/artificial intelligence algorithms can account for variations in puck assembly 210 temperature. The one or more machine learning/artificial intelligence algorithms can prompt the controller 150 to initiate corrective action in order to adjust the operating parameters (such as the coolant pressure, coolant inlet/outlet temperature, coolant flow rate, and/or heater 232 current) in order to control the temperature of the puck assembly 210/210' and/or control the uniformity of the temperature of the puck assembly 210/210' across the puck assembly 210/210'.

Embodiments of the present disclosure provide apparatus and methods for processing substrates while maintaining close control of substrate temperature. Embodiments of the present disclosure provide apparatus and methods for maintaining a temperature of a substrate support assembly within a prescribed tolerance range while processing a substrate. Embodiments of the present disclosure provide apparatus and methods for maintaining a temperature of a substrate support assembly across a lateral extent of the substrate support assembly within a prescribed uniformity tolerance range while processing a substrate.

It is contemplated that elements and features of any one disclosed embodiment may be beneficially incorporated in one or more other embodiments. While the foregoing is directed to embodiments of the present disclosure, other and further embodiments of the disclosure may be devised without departing from the basic scope thereof, and the scope thereof is determined by the claims that follow.

What is claimed is:

1. A substrate support assembly comprising:
a shaft including a plurality of coolant conduits;
a platen extending perpendicularly from the shaft at an upper end of the shaft;
a cooling plate mounted to the platen, the cooling plate including a coolant channel fluidically coupled to the plurality of coolant conduits;
a puck assembly mounted to the cooling plate, and secured thereto by a plurality of first fasteners extending through the cooling plate; and
a clamp ring mounted to an underside of the cooling plate by a plurality of second fasteners, the clamp ring sealingly covering the first fasteners and encircling the platen.

2. The substrate support assembly of claim 1, wherein:
the cooling plate includes:
a first portion coupled to the platen; and
a second portion extending beyond an outer rim of the platen;
the coolant channel is fluidically coupled to the plurality of coolant conduits at the first portion; and
the coolant channel extends from the first portion into the second portion.

3. The substrate support assembly of claim 2, wherein the coolant channel defines a pathway including a plurality of loops.

4. The substrate support assembly of claim 1, further comprising a skirt surrounding an outer rim of the cooling plate.

5. The substrate support assembly of claim 4, wherein the skirt includes a lip disposed between the cooling plate and the puck assembly.

6. The substrate support assembly of claim 5, wherein the skirt extends to a location at or below a level of the underside of the cooling plate.

7. The substrate support assembly of claim 4, wherein an outer diameter of the skirt is substantially equal to an outer diameter of the puck assembly.

8. The substrate support assembly of claim 4, wherein the skirt is integrally formed with a puck of the puck assembly.

9. The substrate support assembly of claim 4, wherein the clamp ring includes the skirt.

10. The substrate support assembly of claim 9, wherein the skirt extends to a location level with a top surface of the cooling plate.

11. The substrate support assembly of claim 1, further comprising a thermal choke layer disposed between the puck assembly and the cooling plate.

12. The substrate support assembly of claim 11, wherein the thermal choke layer includes a sheet of a material comprising a polymer, a metal, graphene, or any combination thereof.

* * * * *